Aug. 30, 1960 G. B. HERZOG 2,951,191

SEMICONDUCTOR DEVICES

Filed Aug. 26, 1958 3 Sheets-Sheet 1

INVENTOR.
GERALD B. HERZOG
BY J L Whittaker
ATTORNEY

Aug. 30, 1960 G. B. HERZOG 2,951,191

SEMICONDUCTOR DEVICES

Filed Aug. 26, 1958 3 Sheets-Sheet 2

INVENTOR.
GERALD B. HERZOG
BY J. L. Whittaker
ATTORNEY

INVENTOR.
GERALD B. HERZOG
BY J. L. Whittaker
ATTORNEY

United States Patent Office 2,951,191
Patented Aug. 30, 1960

2,951,191

SEMICONDUCTOR DEVICES

Gerald B. Herzog, Princeton, N.J., assignor to Radio Corporation of America, a corporation of Delaware Filed Aug. 26, 1958, Ser. No. 757,408

11 Claims. (Cl. 317—235)

This invention relates to semiconductor devices, and more particularly to improved unipolar devices.

Semiconductor devices such as transistors may be classified as bipolar and unipolar. Bipolar devices utilize both N-type charge carriers (electrons) and P-type charge carriers (holes) in their operation. Unipolar devices depend for their operation principally on charge carriers of one type.

A typical unipolar transistor comprises a semiconductor body, such as a rod or cylinder of germanium or silicon or the like, having a rectifying electrode disposed between two spaced non-rectifying or ohmic electrodes. The semiconductor body may be of either conductivity type, but is usually N-type, since electron mobility is generally greater than hole mobility. One of the ohmic electrodes is known as the source, while the other is known as the drain. The rectifying electrode, which serves as the input electrode, forms a PN junction with the semiconductor body and is known as the gate. In the operation of the device a current of charge carriers flows from the source electrode through a portion of the semiconductor body to the drain electrode. The current-conducting portion of the semiconductor body between the two ohmic electrodes is known as the channel. In operation, the rectifying electrode is biased in the reverse direction, so as to extend a depletion layer from the PN junction into the semiconductor body and thus increase the resistivity of the conducting channel between the source and the drain. The input signal is impressed on the rectifying gate electrode, and modulates the depth or thickness of the depletion layer, in which the number of available charge carriers has been reduced. The resistance of the semiconductor body is thereby varied by the input signal, and hence the output current flowing between the two ohmic electrodes is modulated by the signal voltage.

One of the problems associated with conventional unipolar devices is due to the fact that, in general, the extension of the depletion layer into the conducting layer is non-linear with increasing reverse bias voltage on the rectifying electrode. The more abrupt the PN junction between the rectifying gate electrode and the conducting channel, the more non-linear is the relation between the increase in depletion layer thickness, hence increase in channel resistivity or decrease in channel conductivity and decrease in output current. The depletion layer thickness associated with a reverse biased PN junction varies as the square root of the control voltage for alloyed junctions, but varies as the cube root of the control voltage for diffused junctions. This variation controls the ratio between an incremental change in the bias voltage applied to the gate, and the resulting incremental change in the output current between source and drain. The above ratio is symbolized as *gm*, and is an important device parameter known as the transconductance characteristic. For many applications, such as distortionless R.F. and I.F. amplifiers, a device having a substantially linear or otherwise controlled transconductance characteristic is highly desirable.

Accordingly, an object of this invention is to provide improved semiconductor devices.

Another object of the invention is to provide improved unipolar transistors.

Still another object of this invention is to provide improved unipolar devices having a substantially linear transconductance characteristic.

An additional object is to provide improved unipolar transistors in which the rate at which channel resistivity increases with increased gate bias is controlled.

But another object is to provide improved unipolar transistors in which the channel conductivity and output current decreases as the bias voltage increases in a more non-linear manner than devices having a conducting channel of uniform cross-sectional area.

Yet another object is to provide improved unipolar transistors in which the channel conductivity and output current decreases as the bias voltage increases in a more linear manner than devices having a conducting channel of uniform cross-sectional area.

These and other objects of the instant invention are accomplished by providing a device comprising a semiconductor body or wafer of given conductivity type having a reverse biased rectifying gate electrode disposed between two spaced ohmic electrodes, the conducting channel or portion of the semiconductor body between said ohmic electrodes being shaped so that increasing the reverse bias voltage increases the channel resistivity and reduces the output current in a predetermined manner. In one embodiment of the invention, the conducting channel is shaped so that the channel resistivity increases linearly with increasing gate bias, and the transconductance characteristic of the device is therefore substantially linear. According to another embodiment of the invention, the conducting channel is shaped so that the channel resistivity increases and the output current decreases in a controlled highly non-linear manner as the gate bias voltage increases. In still another embodiment, the conducting channel is shaped so that the channel resistivity increases and the output current decreases in a more nearly lniear manner as the gate bias voltage increases. In all of said embodiment such improved operation is provided by a conducting channel of non-uniform cross-section, the area of which increases or decreases with increasing distance from the gate electrode and its associated PN junction.

The invention will be described in greater detail by reference to the drawing, in which.

Figures 1, 2, 3, 4, 5:
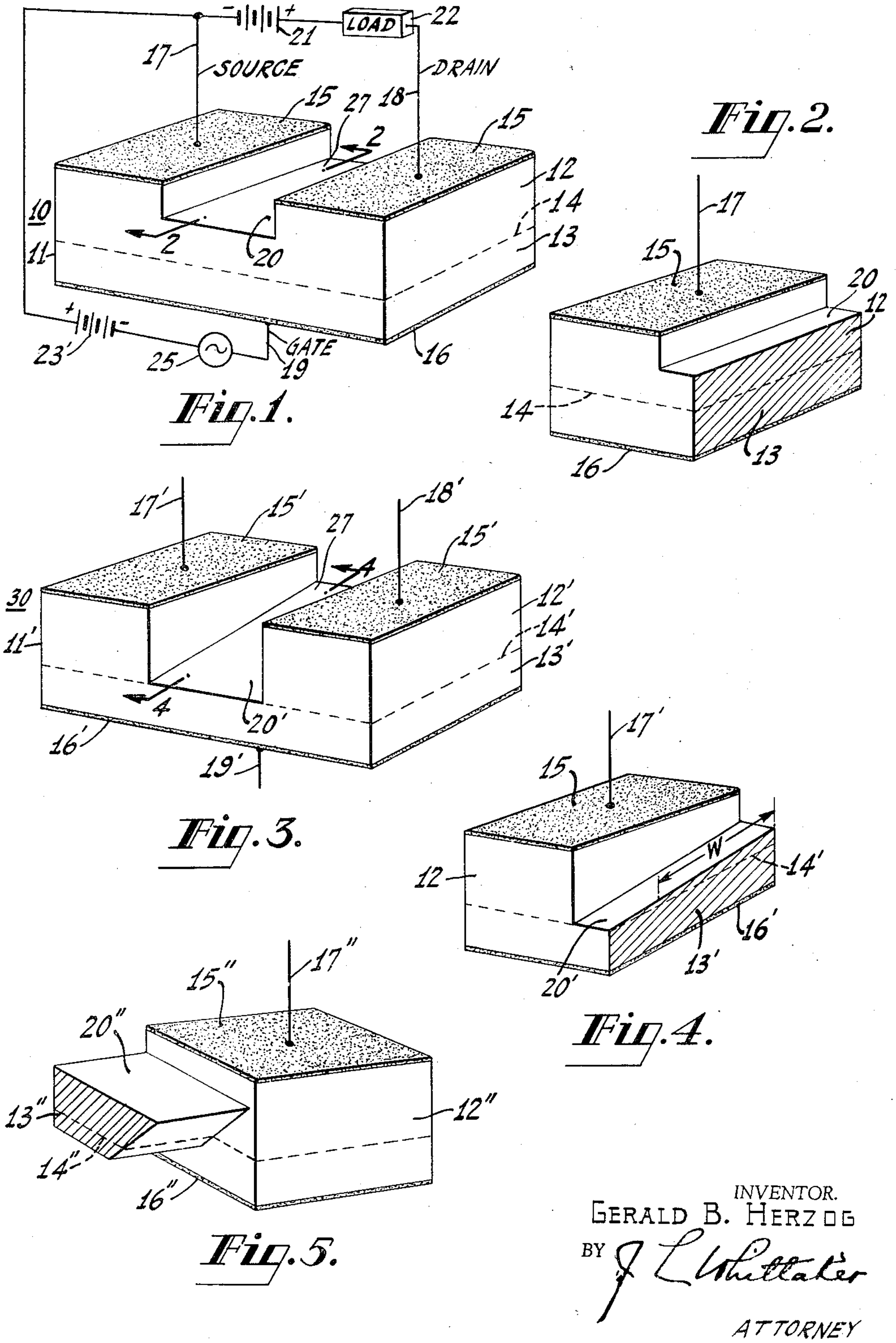
Figure 1 is a perspective view of a unipolar transistor of the prior art.
Figure 2 is a perspective view along section line 1—1 of the device shown in Figure 1.
Figure 3 is a perspective view of a device according to one embodiment of the instant invention.
Figure 4 is a perspective view along section line 3—3 of the device shown in Figure 3.
Figure 5 is a perspective view of the conducting channel in a unipolar transistor according to another embodiment of the instant invention.
Figure 8:
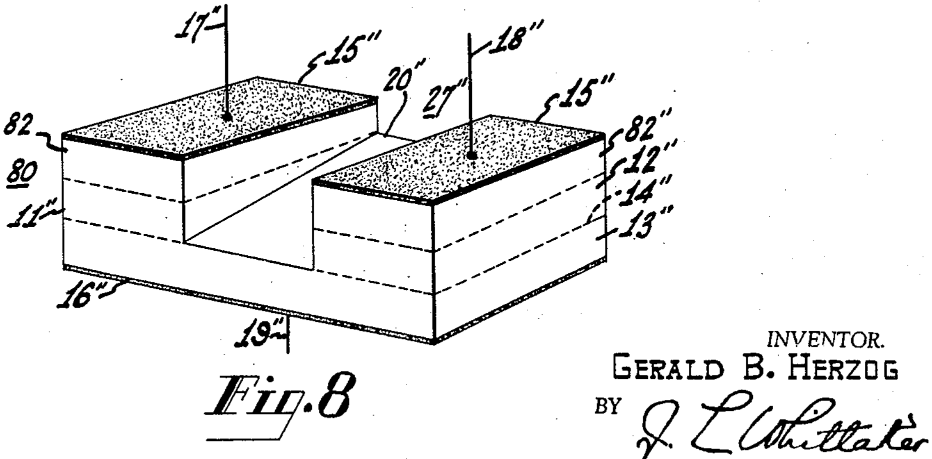
Figure 9:
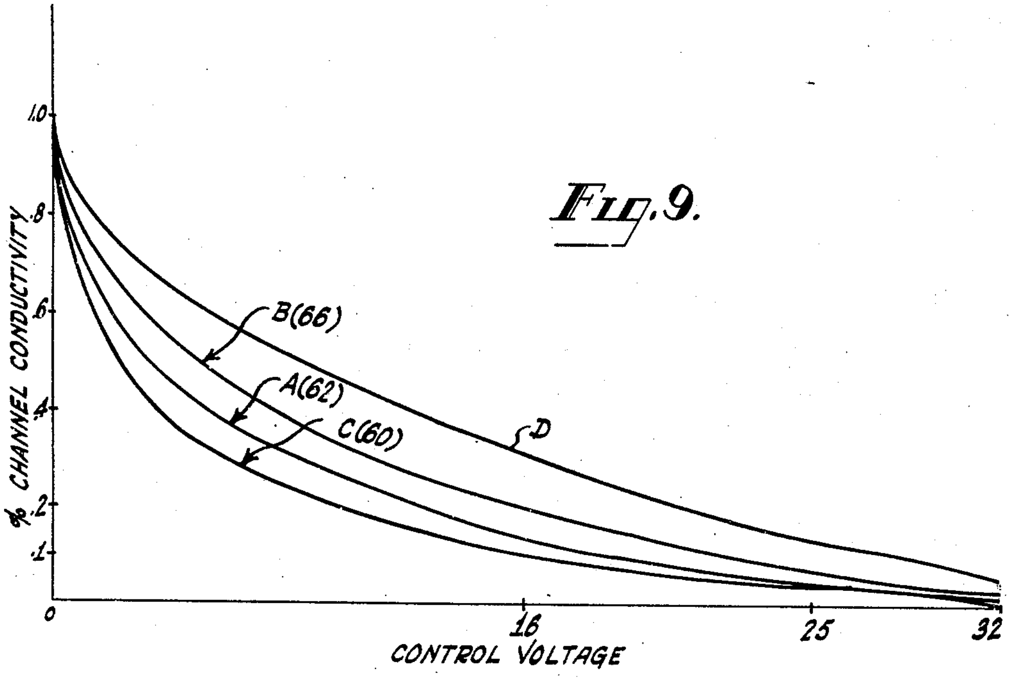
Figure 10:
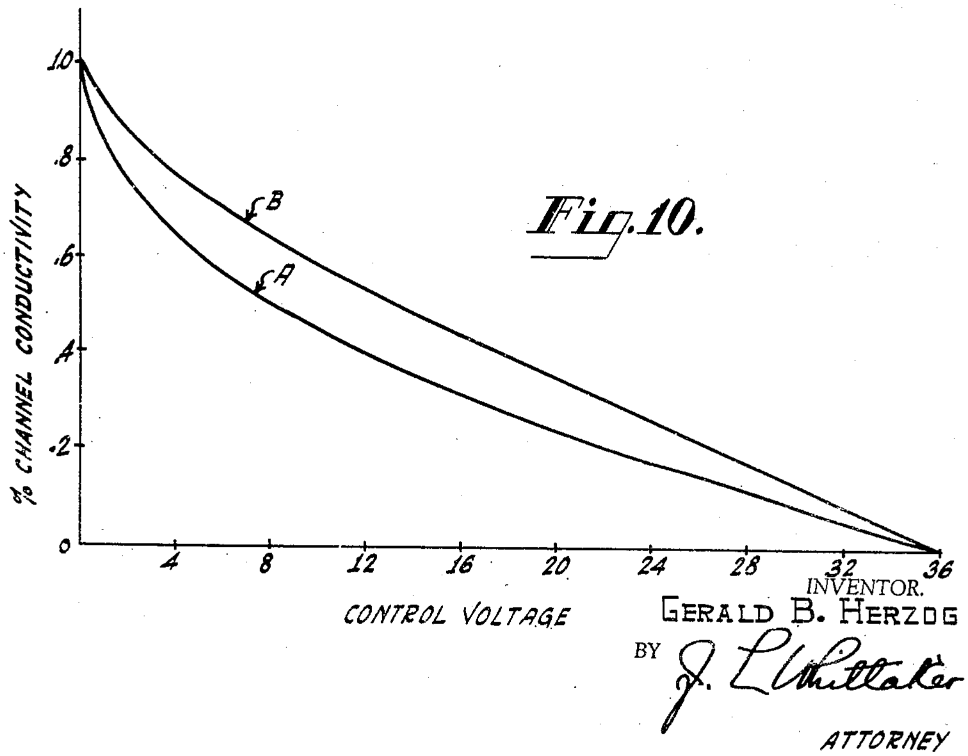

Figures 6*a*–6*f* are cross-sectional views of the conducting channel of unipolar devices according to the instant invention in which the channel resistivity increases and the output current decreases more non-linearly than for a conventional unit;

Figures 7*a*–7*f* are cross-sectional views of the conducting channel of unipolar devices according to the instant invention in which the channel resistivity increases and the output current decreases more linearly than for a conventional unit of the type of Figure 1;

Figure 8 is a graph showing the change in channel area or conductivity with controlled voltage for the devices of Figures 2, 6*a*, 6*b* and 6*c*;

Figure 9 is a graph showing the change in channel area or conductivity with control voltage for the devices of Figures 2 and 7d; and Figure 10 is a graph showing the change in channel width with increasing distance from the PN junction for the devices of Figures 2 and 7*d*.

Similar reference numerals have been applied to similar elements throughout the drawing.

Figure 1 of the drawing shows a prior art unipolar device 10 comprising a body 11 of a given conductivity type monocrystalline semiconductor such as germanium or gallium arsenide or the like. A surface portion or zone 13 of the body 11 is of conductivity type opposite that of the bulk 12 of the body, so that a rectifying barrier or PN junction 14 is formed at the interface between the surface zone 13 and the bulk 12 of body 11. Leads 17 and 18, which serve as the source and drain electrodes respectively of the device, are ohmically connected to opposite ends of the body 11 by means of a conductive metal film 15 which covers the major face of the semiconductor body 11 opposite surface zone 13. A lead 19, which serves as the gate connection, is ohmically connected to surface zone 13, for example, by soldering it to a conductive metal film 16 which covers the surface zone 13. The portion 20 of the body 11 between the source and the drain regions (having PN junction 14 as one boundary) is the conducting channel of the device.

In this example, the gate region 13 is P-type, while the bulk 12 of the body 11 is N-type. In a typical circuit arrangement for unipolar devices having a P-type gate region, the negative terminal of a suitable power supply such a battery 21 is connected to source lead 17. The positive terminal of the battery 21 is connected to the load circuit 22 which in turn is connected to the terminal lead 18 of the device. The gate lead 19 is connected to a signal source 25 and to the negative terminal of a bias battery 23. The positive terminal of the bias battery 23 is connected to the source lead 17. The above polarities are reversed for a device having an N-type gate region.

During the operation of the device 10, a current of electrons from the power supply 21 flows into the semiconductor body 11 at the source electrode 17. The current flows through the conducting channel 20 of semiconductor body 11 to the drain electrode 18 and thence through the load circuit 22 to the battery 21. The gate electrode 19, by means of the bias voltage and signal voltage applied thereto, forms a depletion layer which extends from the rectifying barrier 14 into the conducting channel 20 of the device 10, thereby operating to modulate the resistivity of the conducting channel 20 so as to control the current flowing between the source 17 and the drain electrode 18.

The device 10 may for example be fabricated from a body 11 of N-type silicon by diffusing an acceptor such as boron into one major face of the body, thereby converting a surface zone 13 of the body to P-type and forming a rectifying barrier 14 at the boundary between the P-type and N-type portions of the body. The body 11 is plated on opposite major faces with a metal film which makes a good ohmic contact to the semiconductive body but does not affect its conductivity type. The metal film facilitates the fabrication of good electrical connections by lead wires 17, 18 and 19 to the different regions of the completed device. A metal layer 16 is thus deposited over surface zone 13, and a similar metal layer 15 is deposited on the opposite face of body 11. Nickel is a suitable metal for this purpose. The source and drain regions are then formed as two lands 7 and 8 respectively by cutting a groove 27 in the major face opposite the P-type surface zone 13. The groove 21 may be formed by means of diamond grinding wheels, or by an etching process. Alternatively, the device may be conveniently mass produced utilizing techniques described in an article by H. Nelson entitled "The Preparation Of Semiconductor Devices By Lapping And Diffusion Techniques," Proceedings of the I.R.E., June 1958.

Figure 2 is a perspective view of a section along line 1—1 of the prior art unipolar device of Figure 1, and shows the regular shape of the conducting channel 20. When the depletion layer associated with the reverse biased PN junction 14 extends into the conducting channel 20, the resistivity of the channel increases as a function of the square root of the applied bias voltage for an alloyed junction. If the PN junction is formed by diffusion, the channel resistivity increases as a function of the cube root of the bias voltage on the junction. It will be appreciated that the channel conductivity, and hence output current, always decreases in a non-linear manner as the bias voltage increases in the prior art devices.

In accordance with one embodiment of the instant invention shown in Figure 3, the conducting channel 20′ is shaped so that each additional increment of bias voltage increases the channel resistivity to a lesser extent than the previous increment. Thus in devices according to this embodiment of the invention the output current decreases in a very non-linear manner as the bias voltage increases. Such a device is useful for gamma correction in television studios.

The device 30 shown in Figure 3 may be made from a semiconductive wafer 11′ of given conductivity type. A surface zone 13′ on one major face is converted to conductivity type opposite that of the original wafer, so that a PN junction 14′ is formed at the interface between the surface zone 13′ and the bulk 12′ of the wafer 11′. A conductive metal film 16′ is deposited over surface zone 13′, and a similar inert metal film or layer 15′ is deposited on the opposite major wafer face. Suitable metals for this purpose are nickel, rhodium and palladium. A groove 27′ is cut through the metal film 15′ so as to separate the source and drain regions of the device. The groove 21′ is fabricated by grinding with a diamond wheel which is moved at an angle to the major wafer face. Alternatively, the same structure may be made by masking the wafer with wax, removing the wax from the site where the groove is desired, etching a groove through the unmasked part, then covering a portion of the groove with wax and etching again so as to deepen the uncovered portion of the groove. Thereafter leads 17′ and 18′ are attached to the emitter and collector regions by means of metal film 15′, while collector lead 19′ is similarly attached to the metal film 16′.

Figure 4 is a perspective view of a section along line 3—3 of the first embodiment of the invention shown in Figure 3. It will be seen that the width W of the conducting channel 20′ decreases rapidly with increasing distance from the PN junction 14′. For this reason the first increment of reverse bias voltage applied to the junction 14′ will decrease the conducting channel cross-sectional area and increase the channel resistivity by a greater amount than the next equal increment of bias voltage. Hence the resistivity of channel 20′ in this embodiment increases very rapidly at first and then less rapidly for increasing depletion layer thickness.

Figure 6:
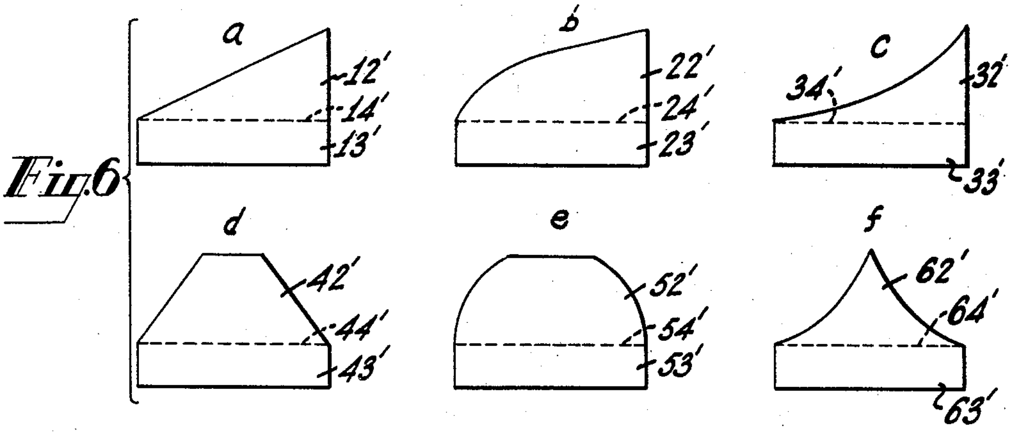
Figure 7:
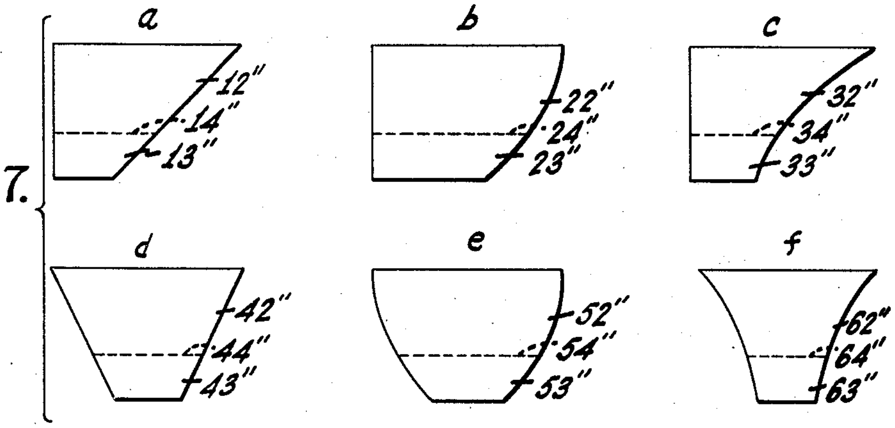

An important feature of this invention is the ease and flexibility with which the transconductance characteristic of unipolar transistors can be adjusted to fit any desired circuit application. For example, Figure 6*a* is a cross-section of the conducting channel of the device according to the invention shown in Figures 3 and 4. If it is desired to produce a device in which the channel resistivity increases and output current decreases rapidly at first but in which the decrease is not as rapid as in the device of Figures 3, 4 and 6*a*, then the conducting channel cross-section is shaped as shown in Figure 6*b*.

If on the contrary it is desired that at first the channel resistivity increase at a rate greater than that of the device shown in Figure 6*a*, then the conducting channel cross-section is shaped as shown in Figure 6*c*. If still other rates of change are desired, the conducting channel cross-sections may be shaped as shown in Figures 6*d*, 6*e* and 6*f*.

Another embodiment of the invention is shown in Figure 5, which is a perspective sectional view similar to Figure 4. It will be appreciated that in this example the width of the conducting channel 20″ increases with increasing distance from the PN junction 14″. In this embodiment the conducting channel 20″ is shaped so that the first increment of distance traveled by the depletion layer increases the channel resistivity by a lesser amount than the next equal increment of the depletion layer thickness, hence the resistivity of channel 20″ in this embodiment, and the output current of the device, increases in a more linear manner than the prior art device of Figure 1, which has a conducting channel of uniform cross-sectional area. Figure 7*a* is a cross-section of the conducting channel of the device shown in Figure 5.

Devices of this type have an advantage over prior art units of Figures 1 and 2 in that the rate of incremental change of output current with control voltage, or transconductance characteristic, can be adjusted for the devices in accordance with the invention by appropriately shaping the conductive channel, while in the prior art units the transconductance characteristic is fixed by the nature of the junction.

If it is desired to produce a device in which the channel resistivity increases less rapidly in the first part of its characteristic than for the device shown in Figure 5, then the conducting channel cross-section is shaped as shown in Figure 7*b*. On the contrary, if it is desired that the channel resistivity increase more rapidly in the first part of its characteristic than for the device shown in Figure 5, then the conducting channel cross-section is shaped as shown in Figure 7*c*. If still other rates of change are desired, the conducting channel cross-section may be shaped as shown in Figures 7*d*, 7*e* and 7*f*.

Unipolar devices according to the invention may also be fabricated so that the channel resistivity increases and the output current decreases linearly with increasing control voltage. Such units are prepared by shaping the cross-section of the conducting channel so that the width of the channel increases with increasing distance from the PN junction. As explained above, the depletion layer thickness associated with a reverse bias PN junction varies as the square root of the bias voltage for alloyed junctions, and as the cube root of the bias voltage for diffused junctions. However, this factor alone is not sufficient to completely determine the shape of the conducting channel for a linear characteristic, since other factors are involved, such as the size and shape of the device, and the degree of abruptness of the PN junction, which depends on the impurity concentration on either side of the PN junction. For this reason some experimentation is required with a particular type of unipolar device to find the conducting channel shape which will yield the most linear transconductance characteristic. In general, it can be stated that the required shape of the conducting channel for linear characteristic unipolar transistors is similar to those shown in Figure 7, that is the cross-sectional width of the conducting channel will increase with increasing distance from the PN junction.

Curve A of Figure 9 shows the change in channel conductivity with controlled voltage for a unipolar device according to the invention having a conducting channel with the cross-section shown in Figure 6*a*. Curve B of Figure 9 similarly shows the change in conductivity with control for a unipolar device having a channel with cross-section of Figure 6*b*, and Curve C is a device with the cross-section of Figure 6*c*. For comparison, Curve D shows the characteristic of the prior art diffused junction device of Figure 2, in which the output current decreases as the square root of the control voltage. Curve A declines non-linearly at first, then becomes more linear. Curve B has an initial portion in which the decline is more linear than the corresponding portion of Curve A, but the remaining portion of Curve B is less linear than Curve A. The initial decline of Curve C is less linear than the corresponding portion of Curve A, but the remaining portion of Curve C is more linear than the corresponding portion of Curve A.

Figure 10 similarly compares the prior art device of Figure 2 with a device according to the instant invention having a conducting channel whose width increases with increasing distance from the PN junction. Curve A shows the change in channel conductivity with controlled voltage for a prior art device according to Figure 2. Curve B similarly shows the change for the device shown in Figure 7*d*. It will be noted that the device according to the invention is more nearly linear over its entire range of operation.

Referring to Figure 8, another embodiment of the invention is shown which is generally similar to that shown of Figure 3. The device 80 is a unipolar transistor comprising a wafer 11″ having a region 12″ of one conductivity type, a surface zone 13″ of opposite conductivity type, a PN junction 14″ between regions 12″ and 13″, source electrode 17″ and drain electrode 18″ separated by groove 27″ and ohmically attached to the wafer 11″ by means of conductive metal film 15″, and control electrode 19″ ohmically attached to gate region 13″ by means of conductive metal film 16″. In this embodiment the device includes a surface zone 82 immediately beneath metal film 15″. The surface zone 82 is of the same conductivity type as zone 12″ but of greater conductivity. The surface zone 82 facilitates the flow of current through source electrode 17″ and drain electrode 18″ to the adjacent region 12″, and thereby improves the electrical characteristics of the device.

It will be understood that the invention can be practiced with all the conventional monocrystalline semiconductive materials, including compounds such as indium phosphide and gallium arsenide. The particular semiconductor selected depends on the application intended. For example, gallium arsenide has a greater energy gap than silicon, and hence a lower reverse current. The mobility of electrons in gallium arsenide is greater than that in silicon, hence the output current of gallium arsenide unipolar devices will be larger than the output of silicon devices by a factor of five.

It will also be understood that the conductivity types of the various zones of the illustrated devices may be reversed, provided that the polarity of the applied bias voltages is similarly reversed as required.

There have thus been described new and useful forms of unipolar semiconductor devices, as well as methods for making these devices.

What is claimed is:

1. A controlled transconductance electrical device comprising a monocrystalline given conductivity type semiconductor body having two opposed major faces, one said major face bearing a groove between two lands, the portion of said body between said lands having a non-uniform cross-sectional shape corresponding to the desired transconductance characteristic, the opposite major face having a surface zone of opposite conductivity type so as to form a rectifying barrier at the interface between said surface zone and the interior zone of said body, and a non-rectifying metal film on said lands and on at least a portion of said opposite major face.

2. A controlled transconductance electrical device comprising a monocrystalline given conductivity type semiconductor body having two opposed major faces, one said major face bearing a groove between two lands, the opposite major face having a surface zone of opposite conductivity type so as to form a rectifying barrier at the interface between said surface zone and the interior zone of said body, and a non-rectifying metal film on said lands and on at least a portion of said opposite major face, the portion of said body between said lands and said barrier serving as a conductive channel therebetween and being shaped with non-uniform cross-section so that the application of a reverse bias voltage to said barrier extends a depletion layer into said channel and reduces the output current in a predetermined ratio.

3. A controlled transconductance electrical device comprising a monocrystalline given conductivity type semiconductor body having two opposed major faces, one said face bearing a groove between two lands, the opposite major face having a surface zone of opposite conductivity type and a rectifying barrier at the interface between said surface zone and the interior zone of said body, a metal film on said lands and on at least a portion of said opposite major face, said metal being electrically conductive but not affecting the conductivity type of said semiconductor, and a conducting channel between said lands bounded by said barrier, said channel being shaped with non-uniform cross-section so that the application of a reverse bias voltage to said barrier extends a depletion layer into said channel and as said bias voltage increases reduces the output current in a more non-linear manner than devices having a conducting channel of uniform cross-sectional area.

4. A controlled transconductance electrical device comprising a monocrystalline given conductivity type semiconductor body having two opposed major faces, one said face bearing a groove between two lands, the opposite major face having a surface zone of opposite conductivity type and a rectifying barrier at the interface between said surface zone and the interior zone of said body, a metal film on said lands and on at least a portion of said opposite major face, said metal being electrically conductive but not affecting the conductivity type of said semiconductor, and a conducting channel between said lands bounded by said barrier, said channel being shaped with non-uniform cross-section so that the application of a reversed bias voltage to said barrier extends a depletion layer into said channel and as said bias voltage increases reduces the output current in a more linear manner than devices having a conducting channel of uniform cross-sectional area.

5. A controlled transconductance electrical device comprising a monocrystalline given conductivity type semiconductor body having two opposed major faces, one said face bearing a groove between two lands, the opposite major face having a surface zone of opposite conductivity type and a rectifying barrier at the interface between said surface zone and the interior zone of said body, a metal film on said lands and on at least a portion of said opposite major face, said metal being electrically conductive but not affecting the conductivity type of said semiconductor, and a conducting channel between said lands bounded by said barrier, said channel being shaped so that the application of a reverse bias voltage to said barrier extends a depletion layer into said channel and reduces the output current in a substantially linear ratio with the increase in said bias voltage.

6. A unipolar transistor comprising a monocrystalline given conductivity type semiconductor body having two opposed major faces, one said major face bearing a groove between two lands, the risistivity of said lands being less than the resistivity of the interior zone of said body, the portion of said body between said lands serving as a conducting channel therebetween and having a non-uniform cross-sectional shape corresponding to the desired transconductance characteristic, the opposite major face having a surface zone of opposite conductivity type and a rectifying barrier at the interface between said surface zone and said interior zone, a metal film on said lands and on at least a portion of said opposite major face, said metal being electrically conductive but not affecting the conductivity type of said semiconductor, and leads attached to said metal film on each said land and on said opposite face.

7. A controlled transconductance unipolar transistor comprising a monocrystalline N-type semiconductive body having two opposed major faces, one said major face bearing a groove between two lands, the resistivity of said lands being less than the resistivity of the interior portion of said body, the portion of said body between said lands having a cross-sectional shape corresponding to the desired transconductance characteristic, the opposite major face having a surface zone of P-type conductivity, a PN junction at the interface between said P-type surface zone and the N-type bulk of said body, a metal film on said lands and on at least a portion of said opposite major face, said film being electrically conductive but not affecting the conductivity type of said semiconductor, and leads attached to said metal film on each said land and on said opposite face.

8. A controlled transconductance unipolar transistor comprising a monocrystalline given conductivity type semiconductor body having two opposed major faces, one said face bearing a groove between two lands, the resistivity of said lands being less than the resistivity of the interior zone of said body, the portion of said body between said lands serving as a conducting channel therebetween, the opposite major face having a surface zone of opposite conductivity type and a rectifying barrier at the interface between said surface zone and said interior zone, the portion of said body between said lands being shaped so that the application of a reverse bias voltage to said barrier extends a depletion layer into said channel and reduces the output current in a substantially linear ratio, a metal film on said lands and on at least a portion of said opposite major face, said metal being electrically conductive but not affecting the conductivity type of said semiconductor, and leads attached to said metal film on each said land and on said opposite face.

9. A unipolar transistor comprising a monocrystalline given conductivity type semiconductor body having two opposed major faces, one said major face bearing a groove between two lands, the resistivity of said lands being less than the resistivity of the interior zone of said body, the portion of said body between said lands serving as a conducting channel therebetween, the opposite major face having a surface zone of opposite conductivity type and a rectifying barrier at the interface between said surface zone and said interior zone, the portion of said body between said lands being shaped with non-uniform cross-section so that the application of a reverse bias voltage to said barrier extends a depletion layer into said channel and as said bias voltage increases reduces the output current in a more non-linear manner than devices having a conducting channel of uniform cross-sectional area, a metal film on said lands and on at least a portion of said opposite major face, said metal being electrically conductive but not affecting the conductivity type of said semiconductor, and leads attached to said metal film on each said land and on said opposite major face.

10. A unipolar transistor comprising a monocrystalline N-type semiconductor body having two opposed major faces, one said major face bearing a groove between two lands, the resistivity of said lands being less than the resistivity of the interior zone of said body, the portion of said body between said lands serving as a conducting channel therebetween, the opposite major face having a surface zone of P-type conductivity and a rectifying barrier at the interface between said P-type surface zone and the N-type bulk of said body, the portion of said body between said lands being shaped with non-uniform cross-section so that the application of a reverse bias voltage to said barrier extends a depletion layer into said channel and as said bias voltage increases reduces the output current in a more non-linear manner than devices having a conducting channel of uniform cross-sectional area, a metal film on said lands and on at least a portion of said opposite major face, said metal being electrically conductive but not affecting the conductivity type of said semiconductor, and leads attached to said metal film on each said land and on said opposite major face.

11. A controlled transconductance unipolar transistor comprising a monocrystalline N-type semiconductive body having two opposed major faces, one said major face bearing a groove between two lands, the resistivity of said lands being less than the resistivity of the interior portion of said body, the portion of said body between said lands serving as a conducting channel therebetween, the opposite major face having a surface zone of P-type conductivity, a PN junction at the interface between said P-type surface zone and the N-type bulk of said body, the portion of said body between said lands being shaped so that the application of a reverse bias voltage to said PN junction extends a depletion layer into said channel and as said bias voltage increases reduces the channel conductivity in a more linear manner than devices having a conducting channel of uniform cross-sectional area, a metal film on said lands and on at least a portion of said opposite major face, said film being electrically conductive but not affecting the conductivity type of said semiconductor, and leads attached to each said metal film on each said land and on said opposite face.

References Cited in the file of this patent

UNITED STATES PATENTS

| | | |
|---|---|---|
| 2,648,805 | Spenke et al. | Aug. 11, 1953 |
| 2,744,970 | Shockley | May 8, 1956 |
| 2,748,041 | Leverenz | May 29, 1956 |
| 2,820,154 | Kurshan | Jan. 14, 1958 |
| 2,836,797 | Ozarow | May 27, 1958 |
| 2,869,055 | Noyce | Jan. 13, 1959 |